United States Patent
Mueller et al.

(10) Patent No.: US 6,853,744 B2
(45) Date of Patent: Feb. 8, 2005

(54) SYSTEM AND METHOD FOR CONFIRMING ELECTRICAL CONNECTION DEFECTS

(75) Inventors: Horst Mueller, Loveland, CO (US); Sunit Bhalla, Ft. Collins, CO (US); Kris Kanack, Loveland, CO (US); Stig Oresjo, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 614 days.

(21) Appl. No.: 10/021,972

(22) Filed: Dec. 14, 2001

(65) Prior Publication Data

US 2003/0113009 A1 Jun. 19, 2003

(51) Int. Cl.[7] .................................................. G06K 9/00
(52) U.S. Cl. ................................. 382/147; 348/126
(58) Field of Search ................................ 382/141, 145, 382/147, 149; 348/86, 87, 125, 126; 356/237.1; 702/57–59

(56) References Cited

U.S. PATENT DOCUMENTS

| | | | |
|---|---|---|---|
| 4,926,452 A | 5/1990 | Baker et al. ................... 378/22 |
| 5,081,656 A | 1/1992 | Baker et al. ................... 378/21 |
| 5,097,492 A | 3/1992 | Baker et al. ................... 378/22 |
| 5,199,054 A | 3/1993 | Adams et al. .................. 378/21 |
| 5,259,012 A | 11/1993 | Baker et al. ................... 378/21 |
| 5,291,535 A | 3/1994 | Baker et al. ................... 378/22 |
| 5,561,696 A | 10/1996 | Adams et al. .................. 378/58 |
| 5,583,904 A | 12/1996 | Adams .......................... 378/22 |
| 5,594,768 A * | 1/1997 | Fujii et al. .................... 378/21 |
| 5,621,811 A | 4/1997 | Roder et al. .................. 382/147 |
| 5,687,209 A | 11/1997 | Adams .......................... 378/22 |
| 5,903,353 A * | 5/1999 | Raymond .................... 356/620 |
| 6,084,663 A | 7/2000 | Seng |
| 6,314,201 B1 | 11/2001 | Roder |
| 6,581,023 B1 * | 6/2003 | Kim ........................... 702/155 |

FOREIGN PATENT DOCUMENTS

EP 0683389 5/1995

* cited by examiner

Primary Examiner—Bhavesh M. Mehta
Assistant Examiner—John Strege

(57) ABSTRACT

An improved circuit board inspection system incorporates a technique that confirms observed electrical connection defects. The improved circuit board inspection system applies a localized investigative routine upon portions of a printed circuit board having one or more identified defects. The technique accounts for the slope of a portion under test of the printed circuit board and provides results that are more accurate from inspection systems that report electrical connection defects.

42 Claims, 11 Drawing Sheets

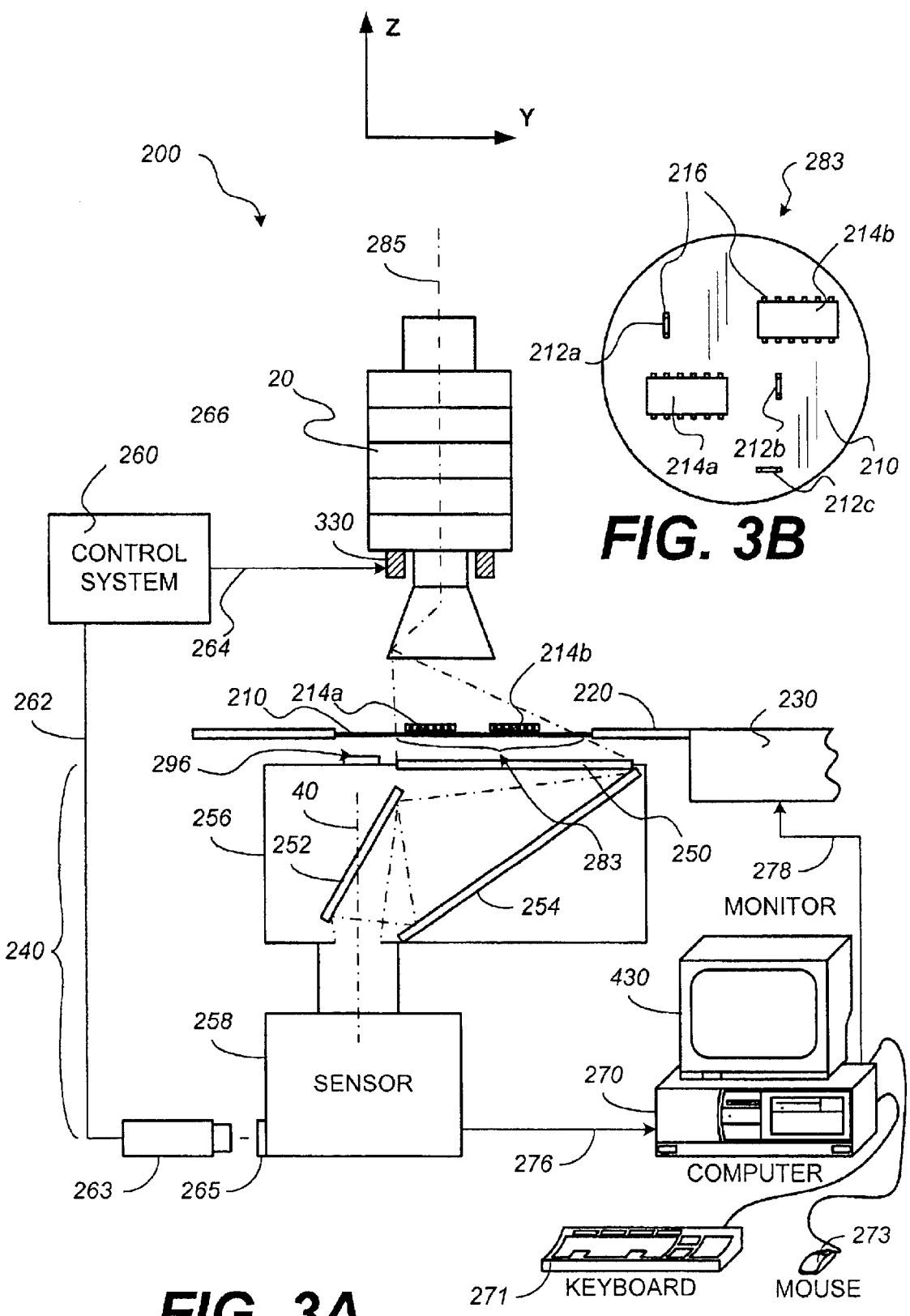

SYSTEM AND METHOD FOR CONFIRMING ELECTRICAL CONNECTION DEFECTS

TECHNICAL FIELD

The present disclosure relates generally to systems and methods for high-resolution inspection of circuit board assemblies using computerized laminography systems, and in particular, to systems and methods, which measure electrical connections within circuit board assemblies for quality control analysis.

BACKGROUND OF THE INVENTION

Rapid and precise quality control inspections of the soldering and assembly of electronic devices have become priority items in the electronics manufacturing industry. The reduced size of components and solder connections, the resulting increased density of components on circuit board assemblies and the advent of surface mount technology (SMT), which places solder connections underneath device packages where they are hidden from view, have made rapid and precise inspections of electronic devices and the electrical connections between devices very difficult to perform in a manufacturing environment.

Many existing inspection systems for electronic devices and connections make use of penetrating radiation to form images, which highlight features representative of the internal structure of the devices and connections. These systems often utilize conventional radiographic techniques wherein the penetrating radiation comprises X-rays. Medical X-ray images of various parts of the human body, for example, the chest, arms, legs, spine, etc., are perhaps the most familiar examples of conventional radiographic images. The images or pictures formed represent the X-ray shadow cast by an object being inspected when the object is illuminated by a beam of X-rays. The X-ray shadow is recorded by an X-ray sensitive material such as film or by other suitable means.

The appearance of the X-ray shadow or radiograph is determined not only by the internal structural characteristics of the object, but also by the direction from which the incident X-rays strike the object. Therefore, a complete interpretation and analysis of X-ray shadow images, whether performed visually by a person or numerically by a computer, often requires that certain assumptions be made regarding the characteristics of the object and its orientation with respect to the X-ray beam. For example, it is often necessary to make specific assumptions regarding the shape, internal structure, etc., of the object and the direction of the incident X-rays upon the object. Based on these assumptions, features of the X-ray image may be analyzed to determine the location, size, shape, etc., of the corresponding structural characteristic of the object. Thus, features of an X-ray image of a solder joint may be analyzed to identify a defect in a solder connection, which produced various image features.

However, these assumptions often create ambiguities that degrade the reliability of the interpretation of the images and the decisions based upon the analysis of the X-ray shadow images. One of the primary ambiguities resulting from the use of such assumptions in the analysis of conventional radiographs is that small variations of a structural characteristic within an object, such as the shape, density, and size of a defect within a solder connection, are often masked by the overshadowing mass of the solder connection itself as well as by neighboring solder connections, electronic devices, circuit boards, and other objects. Since the overshadowing mass and neighboring objects are usually different for each solder joint, it is extremely cumbersome and often nearly impossible to make enough assumptions to precisely determine shapes, sizes, and locations of solder defects within individual electrical connections.

In an attempt to compensate for these shortcomings, some systems incorporate the capability of viewing the object from a plurality of angles. The additional views enable these systems to partially resolve the ambiguities present in the X-ray shadow projection images. However, utilization of multiple viewing angles necessitates a complicated mechanical handling system, often requiring as many as five independent, non-orthogonal axes of motion. This degree of mechanical complication leads to increased expense, increased size and weight, longer inspection times, reduced throughput, impaired positioning precision due to the mechanical complications, and calibration and computer control complications due to the non-orthogonality of the axes of motion.

Many of the problems associated with the conventional radiography techniques discussed above may be alleviated by producing cross-sectional images of the object being inspected. Tomographic techniques such as laminography and computer-aided tomography (CT) have been used in medical applications to produce cross-sectional or body-section images. In medical applications, these techniques have met with widespread success, largely because relatively low resolution, on the order of one or two millimeters (approximately 0.04 to 0.08 inches), is satisfactory and because speed and throughput requirements are not as severe as the corresponding industrial requirements.

In the case of electronics inspection, and more particularly, for inspection of electrical connections such as solder joints, image resolution on the order of several micrometers, for example, 20 micrometers (approximately 0.0008 inches) is preferred. Furthermore, an industrial solder joint inspection system must generate multiple images per second in order to be of practical use on an industrial production line.

Laminography systems, which are capable of achieving the speed and accuracy requirements necessary for electronics inspection are described in the following patents: U.S. Pat. No. 4,926,452, entitled, "AUTOMATED LAMINOGRAPHY SYSTEM FOR INSPECTION OF ELECTRONICS," issued to Baker et al.; U.S. Pat. No. 5,097,492, entitled, "AUTOMATED LAMINOGRAPHY SYSTEM FOR INSPECTION OF ELECTRONICS," issued to Baker et al.; U.S. Pat. No. 5,081,656, entitled, "AUTOMATED LAMINOGRAPHY SYSTEM FOR INSPECTION OF ELECTRONICS," issued to Baker et al.; U.S. Pat. No. 5,291,535, entitled, "METHOD AND APPARATUS FOR DETECTING EXCESS/INSUFFICIENT SOLDER DEFECTS," issued to Baker et al.; U.S. Pat. No. 5,621,811, entitled, "LEARNING METHOD AND APPARATUS FOR DETECTING AND CONTROLLING SOLDER DEFECTS," issued to Roder et al.; U.S. Pat. No. 5,561,696, entitled, "METHOD & APPARATUS FOR INSPECTING ELECTRICAL CONNECTIONS," issued to Adams et al.; U.S. Pat. No. 5,199,054, entitled, "METHOD AND APPARATUS FOR HIGH RESOLUTION INSPECTION OF ELECTRONIC ITEMS," issued to Adams et al.; U.S. Pat. No. 5,259,012, entitled, "LAMINOGRAPHY SYSTEM AND METHOD WITH ELECTROMAGNETICALLY DIRECTED MULTIPATH RADIATION SOURCE," issued to Baker et al.; U.S. Pat. No. 5,583,904, entitled, "CONTINUOUS LINEAR SCAN LAMINOGRAPHY SYSTEM AND METHOD," issued to Adams; and U.S. Pat. No.

5,687,209, entitled, "AUTOMATIC WARP COMPENSATION FOR LAMINOGRAPHIC CIRCUIT BOARD INSPECTION," issued to Adams. The entirety of each of the above referenced patents is hereby incorporated herein by reference.

In a laminography system, which views a fixed object and has an imaging area that is smaller than the object being inspected, it may be necessary to move the object around to position different regions of the object within the imaging area and or move the sensor while keeping the object being tested stationary, thus generating multiple laminographs, which, when pieced together, form an image of the entire object. This is frequently achieved by supporting the object on a mechanical handling system, such as an X-Y-Z positioning table. The table is moved to bring the desired regions of the object into the imaging area. Movement in the X and Y directions locates the region to be examined, while movement in the Z direction moves the object up and down to select the plane within the object where the cross-sectional image is taken.

Several of the above-referenced patents disclose devices and methods for the generation of cross-sectional images of test objects at a fixed or selectable cross-sectional image focal plane. In these systems, an X-ray source system and an X-Ray detector system are separated in the "Z" axis direction by a fixed distance and the cross-sectional image focal plane is located at a predetermined specific position in the "Z" axis direction. This position is intermediate with respect to the positions of the X-ray source system and the X-ray detector system along the "Z" axis. The X-Ray detector system collects data from which a cross-sectional image of features in the test object, located at the cross-sectional image focal plane, can be formed. These systems postulate that the features desired to be imaged are located in the fixed or selectable cross-sectional image focal plane at the predetermined specific position along the "Z" axis. Thus, in these systems, it is essential that the positions of the cross-sectional image focal plane and the plane within the object, which is desired to be imaged, be configured to coincide at the same position along the "Z" axis. If this condition is not met, then the desired image of the selected feature within the test object will not be acquired. Instead, a cross-sectional image of a plane within the test object, which is either above or below the plane that includes the selected feature, will be acquired.

Presently, one technique commonly used for positioning the selected feature of the test object within the cross-sectional image focal plane physically measures the "Z"-axis position of the selected feature. Using this measurement, the test object is then positioned along the "Z" axis such that the selected feature coincides with the "Z"-axis position of the cross-sectional image focal plane. Any of a variety of standard methods and instruments may be used to physically measure the "Z"-axis position of the selected feature of the test object. There are several types of commercially available Z-axis ranging systems, which are used to determine the distance between a known location in "Z" and a feature on the surface, or just below the surface, of the test object. Such systems are as simple as mechanically fixing the test object, a mechanical probe, a laser-based optical triangulation system, an optical-interferometric system, and an ultrasonic system, among others. Any one of these "Z"-axis position measuring systems may be used to form a "Z-map" of the surface of the test object. The "Z-map" typically consists of an array of X-Y position locations associated with the Z-values of the surface of the test object at the particular X-Y position. The locations (i.e., X-Y positions) are points on a plane shared with the test object that are substantially parallel to the cross-sectional image focal plane. The "Z"-axis positioning systems most commonly used in circuit board inspection systems use laser-based range finders.

Range finders have been used for cross-sectional X-ray image systems that are used to image electronic circuit board assemblies. Circuit board assemblies are typically very thin in comparison to the surface area on which the components are mounted. Some circuit assemblies are made with very dimensionally stable material, such as ceramic substrates. However, the majority of circuit board assemblies are constructed with a material that is somewhat flexible or in some cases very flexible. This flexibility allows the board to develop a warp in the axis perpendicular to the major surface areas (i.e., the surface areas that contain interface pins) or the "Z" dimension. Additionally, some circuit board assemblies have variations in board thickness. Besides electronic assemblies, there are many other objects that have dimensional variation on a scale that is significant when compared to the depth of field of the "Z" focal plane in cross-sectional X-ray imaging. By measuring the surface of a warped test object, the magnitude of the variation in the "Z" dimension can then be used to properly adjust the positional relationship of the test object with respect to the "Z" focal plane of the cross-sectional imaging system so that the desired image of the features of interest within the test object can be imaged.

Specifically, one such range finder system is designed for use in a system such as that described in U.S. Pat. No. 4,926,452 to Baker, et al., hereafter referred to as the '452 patent. The '452 patent discloses a laminography system in which an X-ray based imaging system having a very shallow depth of field is used to examine solid objects such as printed-circuit boards. The shallow depth of field provides a means for examining the integrity of a solder joint without interference from the components above and below the solder joint. The material above and below the solder joint is out of focus, and hence, contributes to a generally uniform background. To provide the desired selectivity, the depth of field of the laminographic-imaging system is on the order of less than approximately 2 millionths of an inch (2 mils.). Unfortunately, surface variations on the printed-circuit board often exceed this tolerance. To overcome this drawback, the surface of the printed-circuit board is mapped using a laser range finder. The detailed laser range finder generated map is then used to position the circuit board with respect to the X-ray imaging system such that the component of interest is in focus even when the board is translated from one field of interest to another.

One disadvantage of circuit board inspection systems is the methodology used in determining whether a measured solder-joint feature is indicative of a solder joint that is "acceptable" or "defective." Present circuit board inspection systems observe recorded data for one or more characteristics of a solder joint under observation. If any of the observed characteristics does not fall within an accepted range of values (i.e., the one or more characteristics exceed a fail threshold) the corresponding solder joint is deemed "defective." After the printed circuit board test is complete, the results for the various electrical connections associated with the devices mounted on the printed circuit board are tallied and a report generated. A technician is then tasked with reworking the "defective" joints before retesting the printed circuit board.

It is desired to reduce the time spent handling, investigating, reworking, and preparing printed circuit boards containing "defective" electrical connections in order to reduce labor costs and manufacturing delays. More particularly, it is desired to reduce labor costs and manufacturing delays that result from inaccurate reporting of "defective" electrical connections.

An investigation of false solder joint defects indicates that there are at least three major sources of the erroneous observations. First, there is a significant amount of variation in height ("Z"-axis) along the mounting surfaces of a printed circuit board that is introduced both before and during the manufacturing process. The variation in height is a result of both variation in thickness as well as printed circuit board warp. Second, programming and or measurement system errors are introduced via incorrect adjustment of the focal plane over the region of interest of the solder joint(s) under observation. Third, there is a significant amount of system error introduced through noise in the various electronic based sub-systems of the printed circuit board inspection system (e.g., the focal plane control, laser range finder, imaging sensor, image analysis system).

Despite the capabilities now available to measure and identify defective solder-joints, it can be appreciated that it would be desirable to have an improved system and method for improving the accuracy of circuit board inspection systems in accurately identifying defective connections used to physically and electrically connect various printed circuit devices on printed circuit boards.

SUMMARY OF THE INVENTION

In response to these and other shortcomings of the prior art, a circuit board inspection system and method for confirming electrical connection defects are disclosed. In one arrangement, the circuit board inspection system divides the surface of a printed circuit board into segments when a test indicates that a connection on the printed circuit board is defective and observes each segment that contains a defective connection while adjusting the focal plane of a sensor. Once the system records an indication that the connection under observation is acceptable, the previous defective result is disregarded.

Some embodiments of the system can be viewed as providing a method for confirming electrical connection defects. In this regard, the method can be summarized by the following steps: dividing the surface of the printed circuit board into views; associating an electrical connection with a corresponding view when a characteristic associated with the electrical connection in an observed image indicates that the connection is defective; analyzing the corresponding view to determine the slope of the surface of the printed circuit board across the view; adjusting the distance between the printed circuit board and a focal plane of a sensor in response to the slope of the view; and observing the characteristic associated with the connection in a subsequent image.

Other systems, methods, and features associated with the confirmation of electrical connection defects that account for acceptable variance in a mounting surface of a printed circuit board used to form a printed circuit assembly will become apparent to one with skill in the art upon examination of the following drawings and detailed description. It is intended that all such additional systems, methods, and features included within this description, are within the scope of the systems and methods for confirming defects as protected by the accompanying claims.

BRIEF DESCRIPTION OF THE DRAWINGS

The system and method for confirming electrical connection defects can be better understood with reference to the following drawings. The components in the drawings are not necessarily to scale emphasis instead is placed upon clearly illustrating the principles of the test methods to confirm electrical connection defects among one or more devices on a printed circuit board. Furthermore, in the drawings, like reference numerals designate corresponding parts throughout the several views.

FIG. 3A is a diagrammatic cross-sectional view of a circuit board inspection system showing how the laminographic image is formed and viewed by a sensor.

FIG. 3B shows a top view enlargement of an inspection region shown in FIG. 3A.

DETAILED DESCRIPTION

Figure 1:
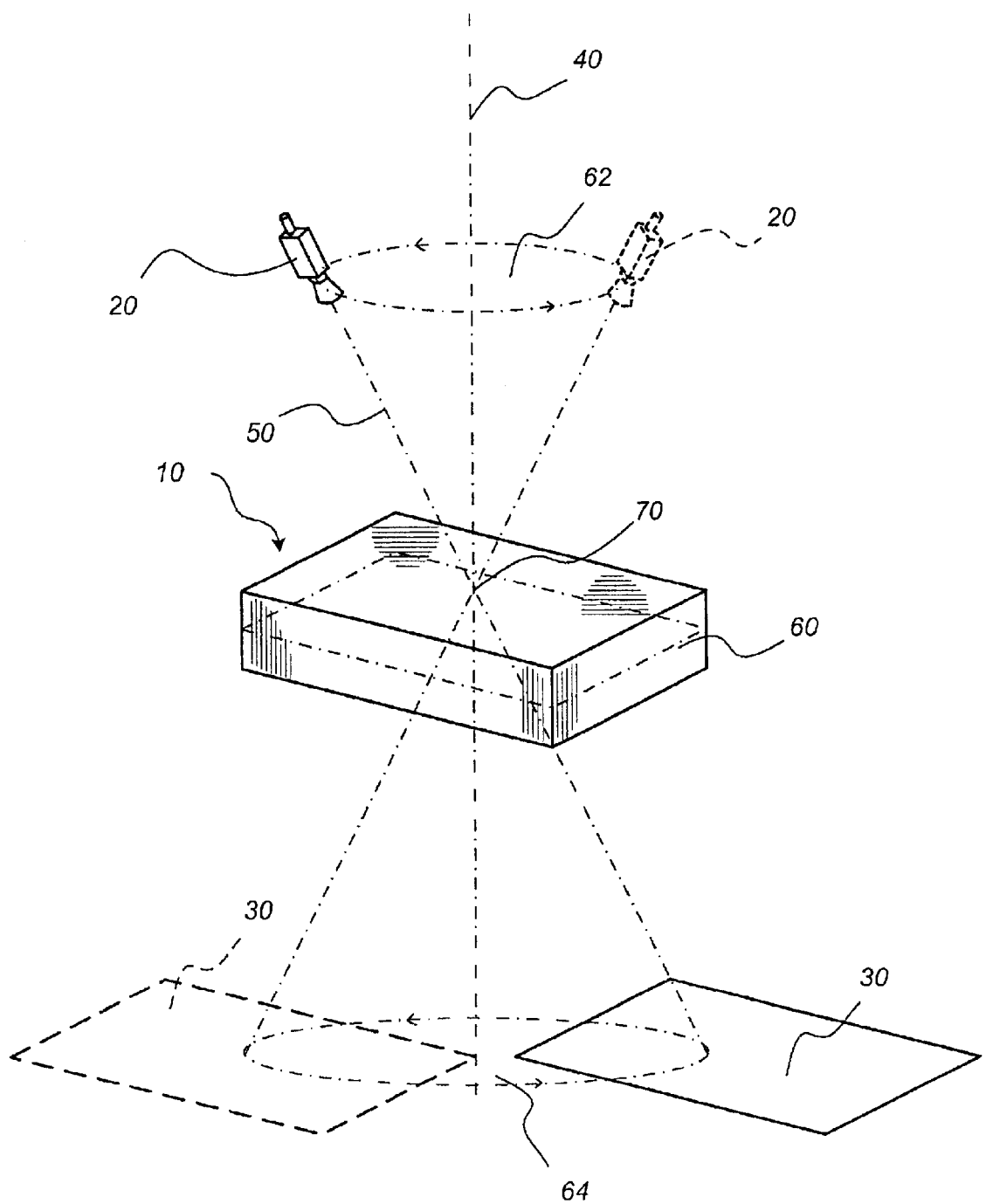
FIG. 1 is a schematic representation of a laminography system illustrating the principles of an exemplar observation technique.

The present invention provides a system and method for confirming electrical connection defects observed on a printed circuit board. Particularly important is that an improved circuit board inspection system configured to apply the method for confirming defects may significantly reduce the number of false "defects" identified upon analyzing one or more measurements of individual electrical connections. An improved circuit board inspection system configured in accordance with the method for confirming electrical connection defects accounts for acceptable variation in the distance between the mounting surface of a printed circuit board and a sensor when observing one or more criteria indicative of a defective connection. More specifically, the method for confirming defects accounts for the variation across the mounting surface of the printed circuit device in order to appropriately relate one or more electrical connections with a sensor before determining and reporting defects.

To facilitate description of the system and methods, an exemplar system is discussed with reference to the figures. The exemplar system and associated methods are provided for purposes of illustration only. Various modifications are feasible without departing from the inventive concept. In this regard, the exemplar system and figures are directed to an X-ray laminography based circuit board inspection system that may be used to inspect solder-joints. It should be appreciated that the method for confirming defects may be implemented by any system capable of generating a plurality of cross-sectional diagnostic images having the appropriate scale to analyze one or more characteristics indicative of electrical connection quality.

In accordance with preferred embodiments, a commercially available circuit board inspection system, such as the 5DX X-ray Inspection System available from Agilent Technologies of Palo Alto, Calif., records location information regarding a plurality of pins (i.e., solder joint interfaces) on each printed circuit device of a printed circuit assembly (i.e., a device populated printed circuit board). Using the location information, the circuit board inspection system observes one or more images for characteristics typically associated with "defective" electrical connections.

Electrical connections (e.g., solder joints) that fail an initial observation are recorded in a "defective" connection list. The improved circuit board inspection system then applies a localized investigative routine upon portions of a printed circuit assembly associated with one or more identified defects to confirm the respective defects. The localized investigative routine adjusts the distance between the center of a portion of the printed circuit board and a sensor responsible for creating the various diagnostic images. This relative Z-height is set in response to the slope of the portion of the mounting surface of the printed circuit board that contains a "defective" connection. Subsequent diagnostic images are acquired and analyzed over a range of Z-heights. The relative Z-height (i.e., the focal plane of a sensor) is adjusted and a corresponding diagnostic image is acquired and analyzed. This process is repeated for a number of adjustment steps based on the size of the area under observation, the focal plane adjustment sensitivity, and the solder joint(s) under observation.

When an analyzed image indicates that the respective solder joint is acceptable, the circuit board inspection system removes the electrical connection from the "defective" electrical connection list. Otherwise, when the localized investigative routine does not detect an image cross-section with an electrical connection characteristic indicative of an acceptable connection, the defective connection is confirmed. The localized investigative routine is then applied to any remaining regions of the printed circuit board that contain "defective" electrical connections.

Cross-Sectional Image Formation

FIG. 1 shows a schematic representation of a typical laminographic geometry used with the circuit board inspection system. An object 10 under examination, for example, a circuit board, is held in a stationary position with respect to a source of X-rays 20 and an X-ray detector 30. Synchronous rotation of the X-ray source 20 and detector 30 about a common axis 40 causes an X-ray image of the plane 60 within the object 10 to be formed on the detector 30. The image plane 60 is substantially parallel to the planes 62 and 64 defined by the rotation of the source 20 and detector 30, respectively. The image plane 60 is located at the intersection 70 of a central ray 50 from the X-ray source 20 and the common axis of rotation 40. This point of intersection 70 acts as a fulcrum for the central ray 50, thus causing an in-focus cross-sectional X-ray image of the object 10 at the plane 60 to be formed on detector 30 as the source and detector synchronously rotate about the intersection point 70. Structure within the object 10, which lies outside of plane 60 forms a blurred X-ray image on detector 30.

In the laminographic geometry shown in FIG. 1, the axis of rotation of the radiation source 20 and the axis of rotation of the detector 30 are coaxial. However, it is not necessary that these axes of rotation of the radiation source 20 and the detector 30 be coaxial. The conditions of laminography are satisfied and a cross-sectional image of the layer 60 will be produced as long as the planes of rotation 62 and 64 are mutually parallel, and the axes of rotation of the source and the detector are mutually parallel and fixed in relationship to each other. Coaxial alignment is preferred as it reduces the number of constraints upon the mechanical alignment of the apparatus.

FIGS. 2A–2E show laminographs produced by the above described laminographic technique. The object 10 shown in FIG. 2A has test patterns in the shape of an arrow 81, a circle 82 and cross 83 embedded within the object 10 in three different planes 60a, 60b and 60c, respectively.

Figure 2A:
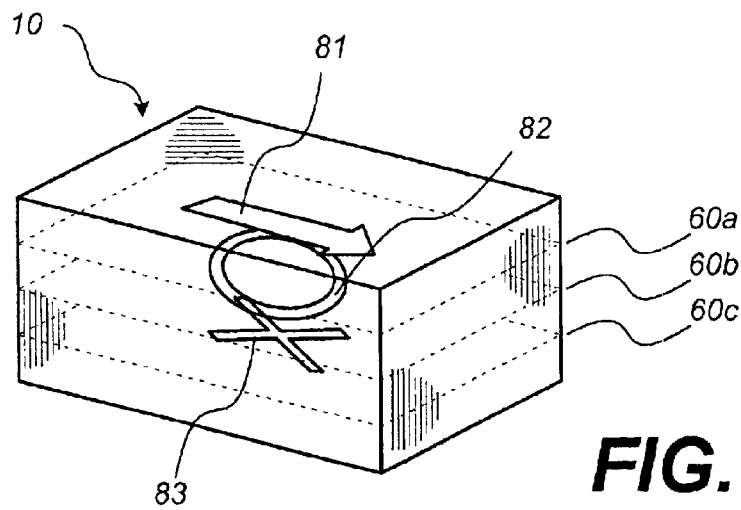
FIG. 2A shows an object having an arrow, a circle, and a cross embedded in an object at three different planar locations.
Figure 2B:
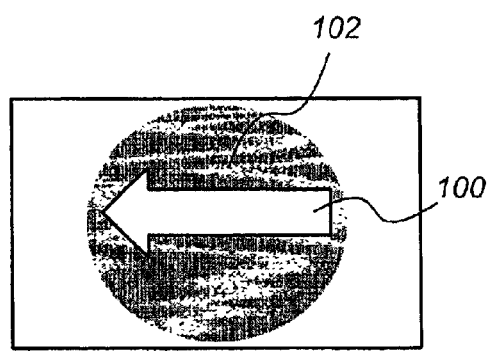
FIG. 2B shows a laminograph of the object in FIG. 2A focused on the plane containing the arrow.

FIG. 2B shows a typical laminograph of object 10 formed on detector 30 (FIG. 1) when the point of intersection 70 lies in plane 60a of FIG. 2A. The image 100 of arrow 81 is in sharp focus, while the images of other features within the object 10, such as the circle 82 and cross 83 form a blurred region 102 which does not greatly obscure the arrow image 100.

Figure 2D:
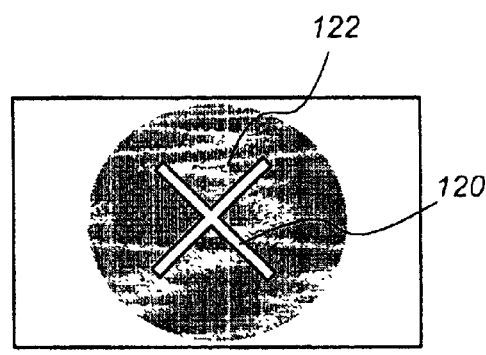
FIG. 2D shows a laminograph of the object in FIG. 2A focused on the plane containing the cross.
Figure 2C:
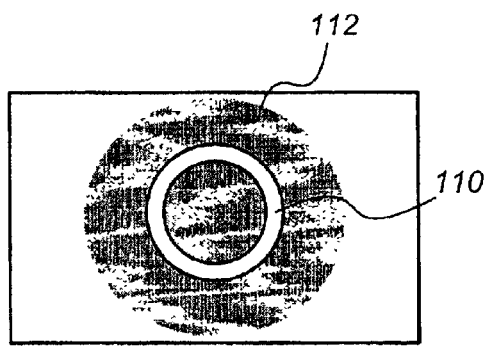
FIG. 2C shows a laminograph of the object in FIG. 2A focused on the plane containing the circle.

Similarly, when the point of intersection 70 lies in plane 60b, the image 110 of the circle 82 is in sharp focus as seen in FIG. 2C. The arrow 81 and cross 83 form a blurred region 112. FIG. 2D shows a sharp image 120 formed of the cross 83 when the point of intersection 70 lies in plane 60c. The arrow 81 and circle 82 form blurred region 122.

Figure 2E:
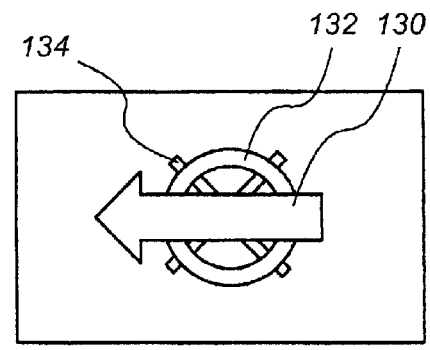
FIG. 2E shows a conventional, two-dimensional X-ray projection image of the objects in FIG. 2A.

For comparison, FIG. 2E shows an X-ray shadow image of object 10 formed by conventional projection radiography techniques. This technique produces sharp images 130, 132, and 134 of the arrow 81, circle 82, and cross 83, respectively, which overlap one another. FIG. 2E illustrates how multiple characteristics contained within the object 10 may create multiple overshadowing features in the X-ray image, which may obscure individual features of the image. It should be appreciated that overshadowing and other observation errors may occur in the case where the printed circuit board or other mounting surface varies in thickness or varies in height due to warp.

FIG. 3A illustrates a schematic diagram of an exemplar laminographic apparatus hereinafter referred to as a circuit board inspection system 200 that may be used to perform the improved techniques for confirming solder-joint defects. In this arrangement, the printed circuit board 210 has multiple electronic components 214 physically mounted on the upper surface. The physical connections are formed by a plurality of electrically conductive connections 216. FIG. 3B, which is a top view enlargement of a region 283 of the circuit board 210, more clearly shows the components 212, 214 and electrical connections 216.

Typically, the connections 216 are formed of solder. However, various other techniques for making the electrical connections 216 are well known in the art. Even though the improved circuit board inspection system 200 and the associated method for confirming solder joint defects will be described in terms of electrical connections, it will be understood that other types of electrical connections 216 including, but not limited to, conductive epoxy, mechanical, tungsten and eutectic bonds may be inspected utilizing the circuit board inspection system 200 and the method for confirming solder-joint defects.

The laminographic apparatus acquires cross-sectional images of the electrical connections (e.g. electrical connections) 216 using the previously described laminographic method or other methods capable of producing equivalent cross-sectional images. The cross-sectional images of the electrical connections 216 may be automatically evaluated to determine their quality. Based on one or more evaluations, a report of the solder joint quality may be recorded and presented to a user of the circuit board inspection system 200.

The laminographic apparatus, as shown in FIG. 3A, comprises an X-ray source 20, which is positioned adjacent printed circuit board 210. The printed circuit board 210 is supported by a fixture 220. The fixture 220 is attached to a positioning table 230 which is capable of moving the fixture 220 and board 210 along three mutually perpendicular axes, X, Y and Z. A rotating X-ray detector 240 comprising a fluorescent screen 250, a first mirror 252, a second mirror 254, and a turntable 256 is positioned adjacent the circuit board 210 on the side opposite the X-ray source 200. A first sensor 258 is positioned opposite mirror 252 for viewing images reflected by the mirrors 252, 254 from fluorescent screen 250. A control system 260 has an input connection 262 from a second sensor 263, which detects the angular position of the turntable 256, and an output connection 264 to X and Y deflection coils 330 on X-ray source 20. A position encoder 265 is attached to sensor 258. The second (i.e., position) sensor 263 is mounted adjacent encoder 265 in a fixed position relative to the axis of rotation 40. The first sensor 258 is connected to a computer 270 via an input line 276. The computer 270 includes the capability to perform high-speed image analysis. An output line 278 from the computer 270 connects the computer to the positioning table 230. A laser range finder 296 is positioned adjacent the circuit board 210 for creating a Z-dimension surface map of the surface of the circuit board 210.

In operation, the circuit board inspection system 200 as shown in FIG. 3A, may produce high-resolution, cross-sectional X-ray images of the electrical connections 216 formed between conductive leads on components 212, 214 and respective pads on the circuit board 210 using the X-ray laminographic method previously described in reference to FIGS. 1 and 2. Specifically, X-ray source 20, as shown in FIG. 3A, comprises a rotating electron beam, which produces a rotating source of X-rays. The X-ray beam illuminates a region 283 of circuit board 210 including the electrical connections 216 located within region 283. X-rays, which penetrate the electrical connections 216, components 212, 214, and the circuit board 210 are intercepted by the rotating fluorescent screen 250.

Dynamic alignment of the position of the X-ray source 20 with the position of rotating X-ray detector 240 is precisely controlled by control system 260. The control system 260 correlates the position of the rotating turntable 256 with calibrated X and Y deflection values that may be stored in a look-up table among other data-storage methods. Drive signals proportional to the calibrated X and Y deflection values are transmitted to the steering or deflection coils 330 on the X-ray source 20. In response to these drive signals, the deflection coils 330 deflect electron beam 285 to locations on an annular shaped target anode such that the position of the X-ray source spot rotates in synchronization with the rotation of detector 240 in the maimer previously discussed in connection with FIG. 1.

X-rays which penetrate the board 210 and strike fluorescent screen 250 are converted to visible light, thus creating a visible image of a single plane within the region 283 of the circuit board 210. The visible light is reflected by mirrors 252 and 254 into the first sensor 258. Sensor 258 typically comprises a low-light level closed circuit television (CCTV) camera, which transmits electronic video signals corresponding to the X-ray and visible images to the computer 270 via line 276. The image analysis feature of computer 270 analyzes and interprets the image to determine the quality of the electrical connections 216.

Computer 270 also controls the movement of positioning table 230 and thus circuit board 210 so that different regions of circuit board 210 may be automatically positioned within inspection region 283.

The laminographic geometry and apparatus shown and described with reference to FIGS. 1–3 are typical of that which may be used in conjunction with the method for confirming solder joint and other electrical connection defects. However, specific details of these systems are not critical to the practice of the method, which addresses the accurate positioning and re-positioning of the circuit board 210 in response to the variation of the mounting surface of the printed circuit board 210 along the Z-axis of the system. For example, the number of computers and delegation of tasks to specific computers may vary considerably from system to system as may the specific details of the X-ray source, detector, circuit board positioning mechanism, etc. One skilled in the art will also recognize that other techniques, including computed tomography (CT), may be used to produce cross-sectional images of specific planes within a solder joint. Furthermore, specific details of various techniques and equipment for creating a Z-dimension surface map of the mounting surface of the circuit board may be utilized. The present invention is applicable to any type of system, which generates cross-sectional images of specific planes within a test object (e.g., electrical connections).

Figure 4:
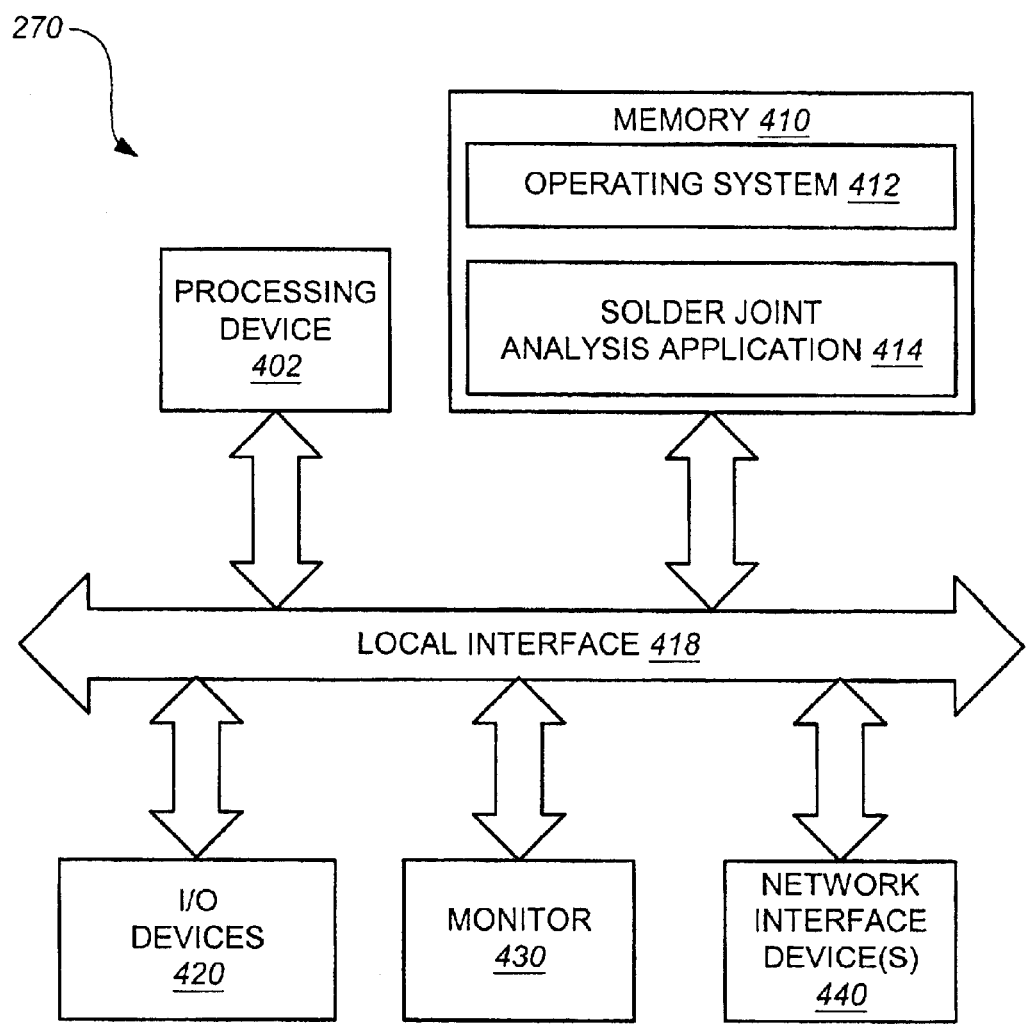
FIG. 4 is a functional block diagram of an exemplar computer that may be used in the circuit board inspection system of FIG. 3A.

Referring now to FIG. 4, illustrated is a functional block diagram showing various components within an exemplar computer 270 that may assist and or direct operation of the circuit board inspection system 200. Generally, FIG. 4 illustrates the various functional building blocks of a computer 270, which can apply the various methods for identifying and confirming solder-joint defects. Generally, the computer 270 can comprise any one of a wide variety of wired and/or wireless computing devices, such as a desktop computer, a portable computer, a dedicated server computer, a multi-processor computing device, among others. Irrespective of its specific arrangement, the computer 270 can, for instance, comprise a processing device 402, memory 410, one or more user input/output devices 420, a monitor 430, and one or more network interface devices 440, each of which is connected via a local interface 418.

The processing device 402 can include any custom made or commercially available processor, a central processing unit (CPU) or an auxiliary processor among several processors associated with the circuit board inspection system 200, a semiconductor based microprocessor (in the form of a microchip), a macro-processor, one or more application-specific integrated circuits (ASICs), a plurality of suitably configured digital logic gates, and other well known electrical configurations comprising discrete elements both individually and in various combinations to coordinate the overall operation of the circuit board inspection system 200.

The memory 410 can include any one of a combination of volatile memory elements (e.g., random access memory (RAM, such as DRAM, SRAM, etc.)) and non-volatile memory elements (e.g., ROM, hard drive, tape, CDROM, etc.). The memory 410 typically comprises an O/S 412, one or more applications such as a solder joint analysis application 414. Persons having ordinary skill in the art will appreciate that the memory 410 can, and typically will, comprise other components, which have been omitted for purposes of brevity. These may include a host of programs configured to control various aspects of the solder joint inspection mechanisms.

The one or more user input/output devices 420 comprise those components with which the user can interact with the circuit board inspection system 200. For example, where the circuit board inspection system 200 comprises a personal computer (PC), these components can comprise a keyboard 271 and a mouse 273 (FIG. 3A). Where the circuit board inspection system 200 is expected to be used in extreme environments (e.g., near a solder flow machine), these components can comprise function keys or buttons, a touch-sensitive screen, a stylus, etc. (not shown). The monitor 430 can comprise a cathode ray source (CRT) based device or a plasma screen for a PC, or alternatively, a liquid crystal display (LCD) as may be desired.

With further reference to FIG. 4, one or more I/O devices 420 may be adapted to facilitate connection of the circuit board inspection system 200 to another computing system and/or data-storage device and may therefore include one or more serial, parallel, small computer system interface (SCSI), universal serial bus (USB), IEEE 1394 (e.g., Firewire™), and/or other interface components that may be used to communicatively couple the circuit board inspection system 200 with one or more remote data-storage devices for recording test measurement results.

The network interface devices 440 comprise the various components used to transmit and/or receive data over a network (not shown). By way of example, the network interface devices 440 may include a device that can communicate both inputs and outputs, for instance, a modulator/demodulator (e.g., a modem), wireless (e.g., a radio-frequency (RF)) transceiver, a telephonic interface, a bridge, a router, a network card, etc.

Various software and/or firmware will be used to manage, coordinate, measure, record, estimate and compare expected values with measured values to generate error values, as well as to perform an outlier analysis on the generated error values, among other functions. The related software and/or firmware responsible for these and other functions associated with the use of the underlying circuit board inspection system 200 can be stored on any computer-readable medium for use by or in connection with any computer-related system or method. In the context of this document, a computer-readable medium denotes an electronic, magnetic, optical, or other physical device or means that can contain or store a computer program for use by or in connection with a computer-related system or method. These programs can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the instruction execution system, apparatus, or device.

The computer-readable medium can be, for example but not limited to, an electronic, magnetic, optical, electromagnetic, infrared, or semiconductor system, apparatus, device, or propagation medium. More specific examples (a non-exhaustive list) of the computer-readable medium include an electrical connection having one or more wires, a portable computer diskette, a random access memory (RAM), a read-only memory (ROM), an erasable programmable read-only memory (EPROM), an electrically erasable programmable read-only memory (EEPROM), or Flash memory, an optical fiber, and a portable compact disc read-only memory (CDROM). Note that the computer-readable medium can even be paper or another suitable medium upon which a program is printed, as the program can be electronically captured, via for instance, optical scanning of the paper or other medium, then compiled, interpreted or otherwise processed in a suitable manner as necessary, and then stored in a computer memory.

Surface Mapping

Figure 5A:
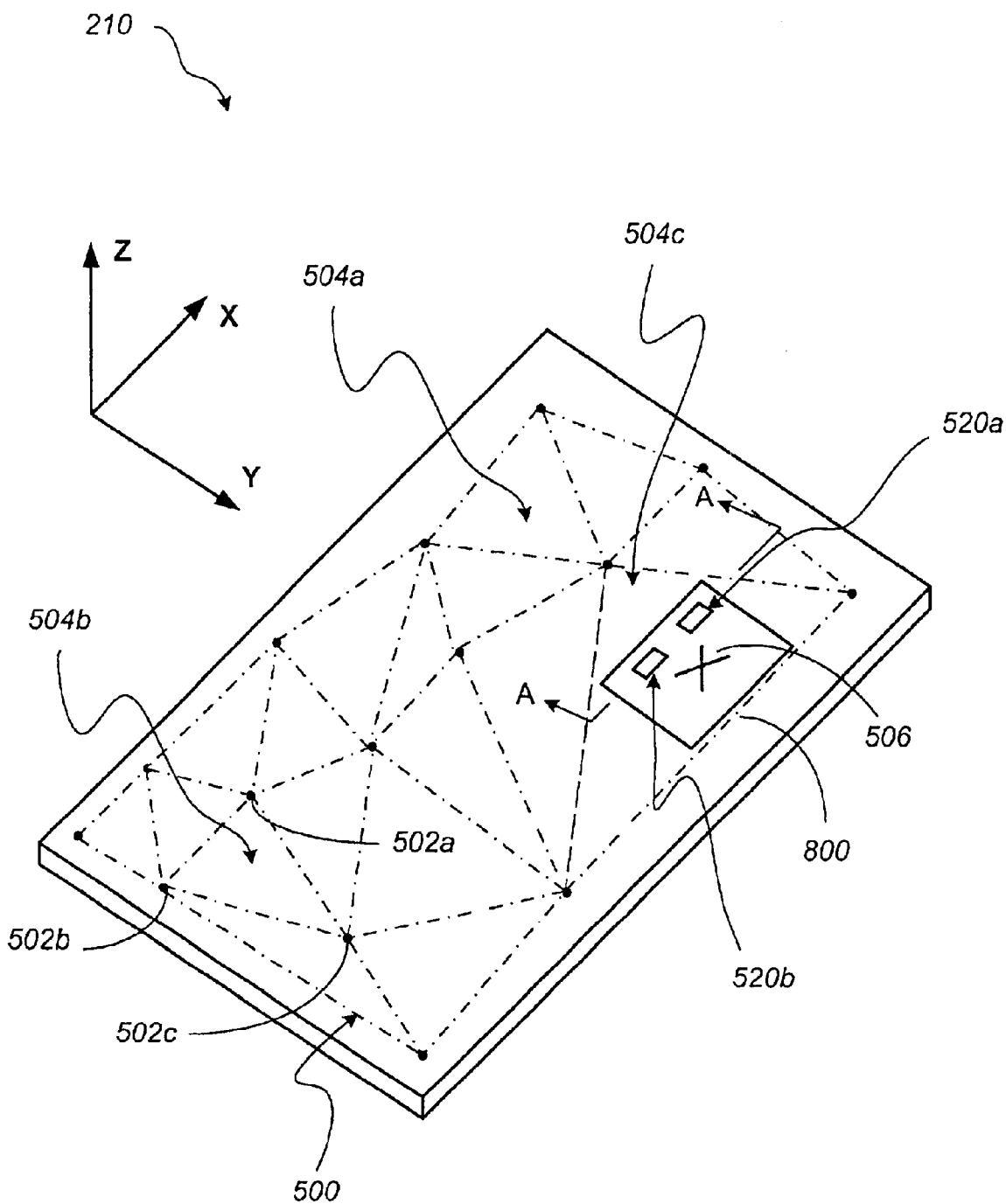
FIGS. 5A and 5B illustrate triangular mesh surface maps and an exemplar observation view of a circuit board under observation.
Figure 5B:
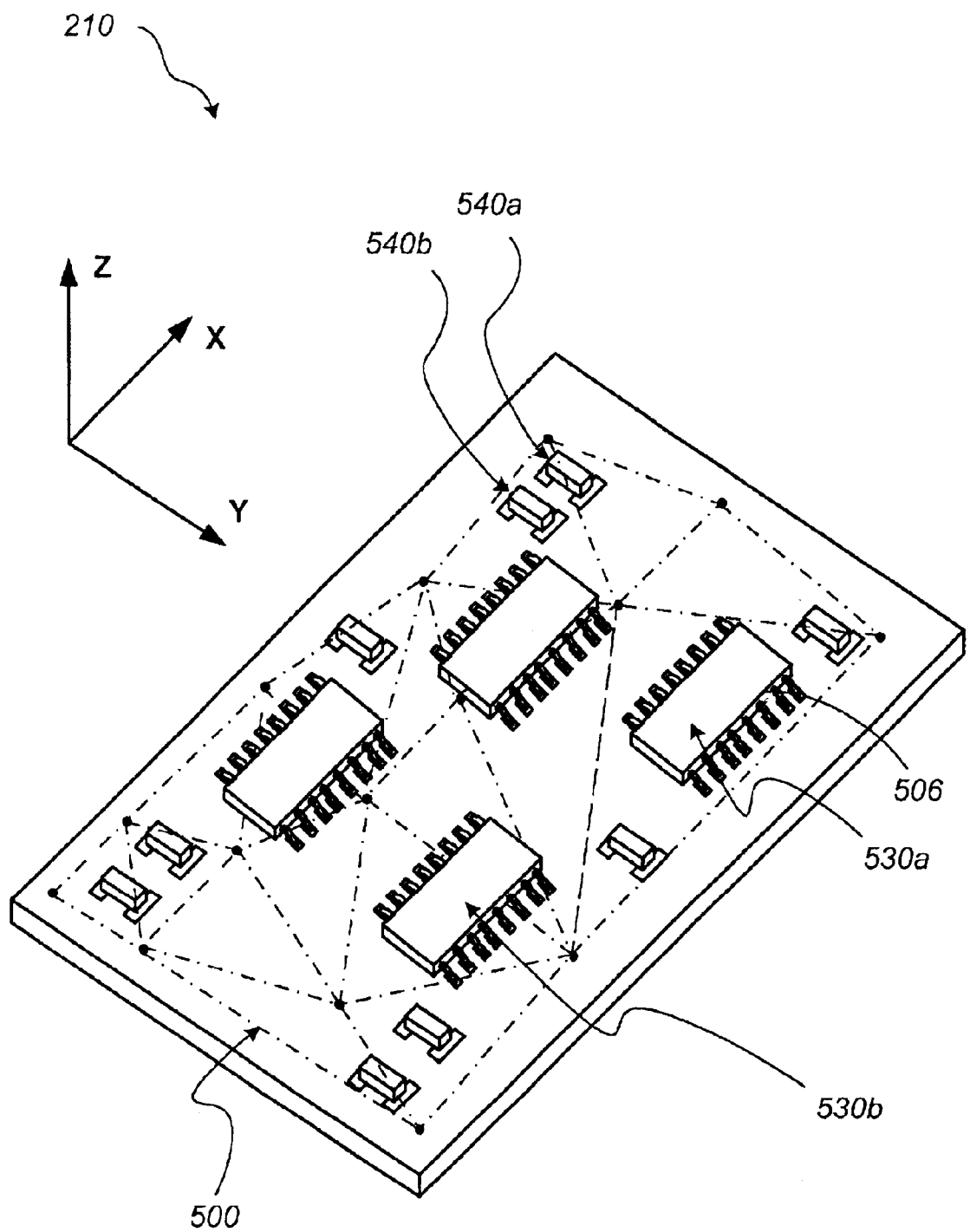

FIGS. 5A and 5B illustrate triangular mesh surface maps and an exemplar observation view of a circuit board under observation. Shown in FIGS. 5A and 5B is an exemplar surface map 500 formed by a plurality of triangular planes 504. The triangular planes 504 are each defined by a set of three measured points 502 on a mounting surface of the printed circuit board 210, with each of the three points 502 positioned in non-populated areas of the mounting surface of the printed circuit board 210. For example, points 502a, 502b, and 502c form the vertices of triangular plane 504b. More specifically, points 502a–502c along the surface of the printed circuit board may each be associated with a relative Z-height. As previously explained, a relative Z-height can be determined using a laser range finder 296 (FIG. 3A) suitably positioned between a Z-reference point and the surface of interest. The resulting Z-dimension information may be coupled with X and Y position information to associate each of the points 502 in a three-dimensional model of a portion of the surface (i.e., a plane). As illustrated in FIG. 5A, the plurality of triangular planes 504 may be used to model (i.e., map) the surface of the printed circuit board 210.

For clarity of illustrating the triangular planes 504 and their relationship to the various electrical connections 216 (FIG. 3B) on the circuit board 210, FIG. 5A shows two exemplar solder pads 520a and 520b located within a view 800. View 800 encompasses a portion of the surface area of the mounting surface of the printed circuit board 210 and has a center location 506 marked with an "X." Other electrical components, which would typically be mounted to the circuit board 210, such as but not limited to, array packages, flip-chips, discrete devices, among others, are not shown.

FIG. 5B illustrates the various triangular planes 504 of an exemplar surface map 500 superimposed over a plurality of printed circuit devices 530 and surface mount discrete devices 540 superimposed on the printed circuit board 210. Note that each of the integrated circuit devices 530 and the surface mount devices 540, among others, may be physically and electrically attached to the printed circuit board 210 via one or more electrical connections 216.

In operation, the laser range finder 296 (FIG. 3A) or some other suitably configured device, determines a Z-axis distance for each of the points 502 on the surface of the board 210. The locations of the points 502 on the surface of the circuit board 210 may be predetermined by the specific design and layout of the various devices (e.g., integrated circuit devices 530 and surface mount devices 540) on the board 210 and the inspection criteria for specific regions of the circuit board 210. It is preferred that the points 502 be located near the electrical connections 216 (See FIG. 3B) being inspected.

Alternatively, a surface map 500 of the surface of the circuit board 210 may be created by measuring the Z-axis coordinates of a selected subset of the electrical connections 216 and/or solder pads on the circuit board 210 using X-ray images. This alternative method for generating a surface map 500 eliminates the laser range finder 296 (FIG. 3A). Consequently, the points 502 may be replaced by "electrical connection positions" and/or pad positions.

When using the laser range finder 296, the size of the each triangular plane 504 forming the surface map 500 is determined by the availability of points 502 which do not interfere with the various devices mounted to board 210 and the desired accuracy of the surface map 500 for specific regions of the board 210. For example, specific regions of the board 210 may have characteristics that require smaller triangular planes 504 to more accurately reflect the Z-elevation of the electrical connections 216 located within a specific plane 504.

Generally, the surface map 500 of the mounting surface of the circuit board 210, represented by the plurality of triangular planes 504, does not coincide with the actual surface of the circuit board 210. However, this approximation of the variation in the Z-dimension of the mounting surface of the printed circuit board 210 permits adequate observation of a significant number of the electrical connections 216 distributed across the mounting surface. Generally, the focal level (i.e., a distance in the Z-dimension measured from a reference level) for a view 800 is determined by taking the center 506 of the area forming the view 800 and using the Z-height for the X-Y location on the associated triangular plane 504 that coincides with the center 506 of the respective view 800. As described above, the focal level or Z-height of an image used in the diagnosis of a particular solder joint may not be suitably arranged (i.e., aligned) with a particular characteristic of interest associated with the solder joint under observation.

Figure 6:
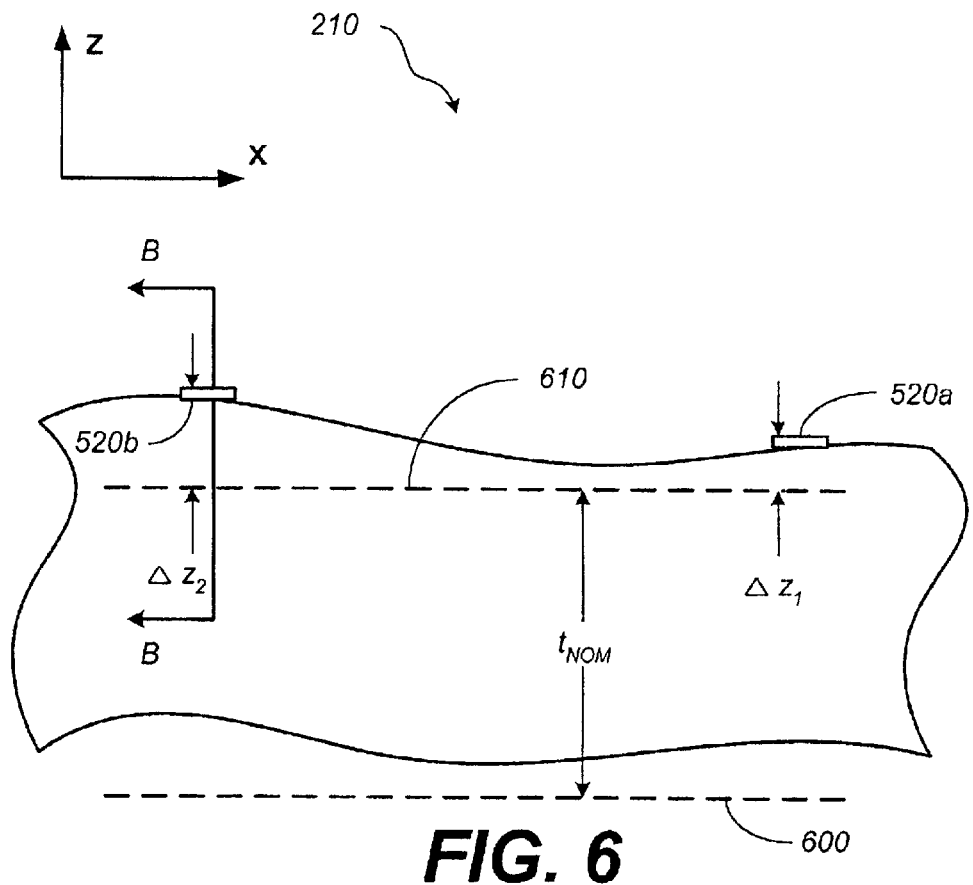
FIG. 6 shows an enlarged cross-sectional view of section A—A of the circuit board of FIG. 5A.

For example, FIG. 6 illustrates an enlarged cross-sectional view of section A—A of the circuit board 210 shown in FIG. 5A. As shown in FIG. 6, a Z-axis reference plane 600 may be defined along the X-Y dimensions and a Z-height 610 corresponding to the focal plane of the sensor 258 may be adjusted such that the Z-height 610 corresponds to the center 506 of the respective view 800 as described above. In this example, the Z-height 610 for center 506 is determined by the corresponding surface map triangular plane 504c (FIG. 5A). In this arrangement, the Z-height 610 corresponds to the Z-axis elevation of the surface map triangular plane 504c at the corresponding X-Y coordinates, which define the view center 506.

Several alternatives for determining a Z-axis reference 600 for a view 800 with respect to the surface map 500 include: a) the average Z-axis elevation of the surface map triangle 504 within which a major portion of a board view 800 is located; or b) a plurality of interpolated Z-axis elevations of the surface map triangle 504 corresponding to the X-Y coordinates, which define specific solder pads 520a, 520b located within a view 800; etc. Also shown in FIG. 6 are solder pads 520a, 520b on the upper (i.e., a mounting) surface of the circuit board 210. As shown in this exaggerated view, the surfaces of the circuit board 210 may not be flat and may not even be parallel to the Z-reference plane 600. In this example, the Z-height 610 for view 800 misses the pads 520a and 520b coupled to two of the electrical connections 216 of interest in the view 800. As further illustrated in FIG. 6, adjusting the Z-height 610 from the Z-reference plane 600 in accordance with the nominal thickness of the printed circuit board 210 under observation (i.e., $t_{NOM}$) is insufficient in the present example to capture image information from electrical connections associated with the pads 520a and 520b. Pad 520a is "out of focus" by at least $\Delta_{Z1}$ and pad 520b is "out of focus" by at least $\Delta_{Z2}$. Consequently, it is highly likely that one or more observations of an image focused at the Z-height 610 will result in one or more analyzed electrical connections 216 being tagged as "defective" as the images will miss the intended electrical connections 216 (not shown) that may be associated above the upper surface of the pads 520a and 520b.

The circuit board inspection system 200 addresses the problem of inaccurate or false solder joint defects by "confirming" the measurement(s) that result in a defective solder joint. A method for confirming solder joint defects may adjust a focal plane or Z-height 610 of a sensor in response to the slope of the view 800 in order to acquire one or more images with a "better" (i.e., more on target) image of a characteristic of an electrical connection 216 previously marked as defective.

Figure 7:
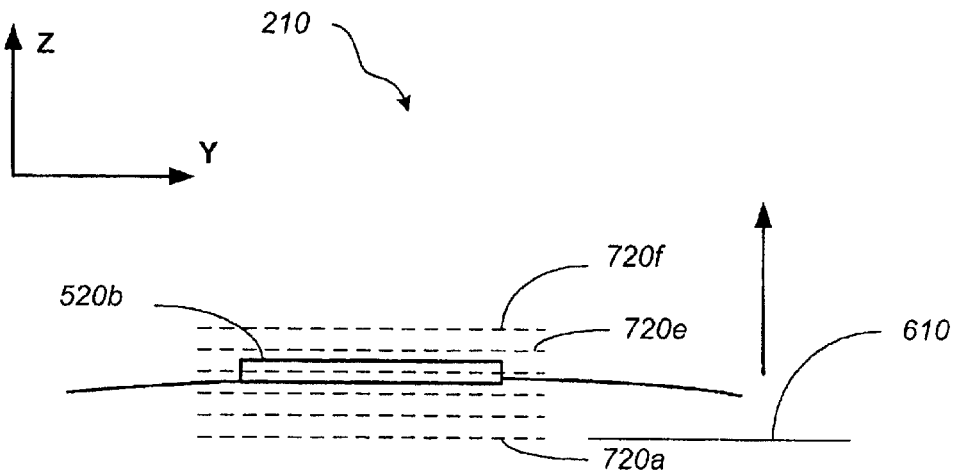
FIG. 7 shows an enlarged cross-sectional view of section B—B of the circuit board of FIG. 6.

FIG. 7 shows an enlarged cross-sectional view of section B—B of the circuit board of FIG. 6 that generally illustrates the confirmation technique. As shown in FIG. 7, a first Z-height 610 disposed from the Z-reference plane 600 in the Z-dimension may locate a first focal plane 720a that may be used in an attempt to acquire an image of the corresponding electrical connection 216 (not shown) associated with pad 520b located on a mounting surface of printed circuit card 210. When observation of one or more characteristics of the electrical connection 216 indicates that the electrical connection 216 is defective, the circuit board inspection system 200 may be programmed to iteratively adjust the focal plane 720 of the sensor 258 (FIG. 3A) until an acquired diagnostic image contains a characteristic indicative of an acceptable electrical connection 216. FIG. 7 illustrates contemplated focal planes 720a through 720f.

Generally, the image which exhibits the best focus is formed at a focal plane that most accurately corresponds to the characteristic of interest of the associated electrical connection 216 coupled to the pad 520b. The image exhibiting the best focus of the electrical connection 216 may be determined by a number of different focus quality parameters. For example, the image that displays the sharpest edges, i.e., the highest variance of the gradients of the image, may be selected as the image exhibiting the best focus. In the example shown in FIG. 7, when the variance of the gradients of the five images formed at the focal planes 720a–720f are computed and compared, the cross-sectional image of an electrical connection 216 (not shown) formed at image plane 720f may exhibit the highest variance of the gradient. While the example shown in FIG. 7 shows six focal planes 720a–720f, it is to be understood that a different number of focal planes 720, either fewer than or more than those illustrated, may be selected in practicing the method for confirming electrical connection defects.

The slope of the view 800 (FIG. 5A) may be used together with the sensitivity of the focal plane adjustment control to determine a desired step size (e.g., change in Z-height 610 between subsequent contemplated focal planes 720) with the step size varying as a direct function of the slope of the view 800. It should be appreciated that too small of a step size between subsequent images may result in an inordinate increase in the overall testing time for the printed circuit board 210, whereas too large of a step size may not result in the acquisition of an image that coincides with an optimum Z-height 610. It should be further appreciated that the step size may be adjusted in accordance with the particular type of electrical connection 216 under observation. For example, surface mount devices 540 (FIG. 5B) generally have solder joints with a lower height than conventional discrete components and other printed circuit devices. Consequently, it may be desirable to increase the step size when observing electrical connections 216 associated with these components and printed circuit devices.

Figure 8:
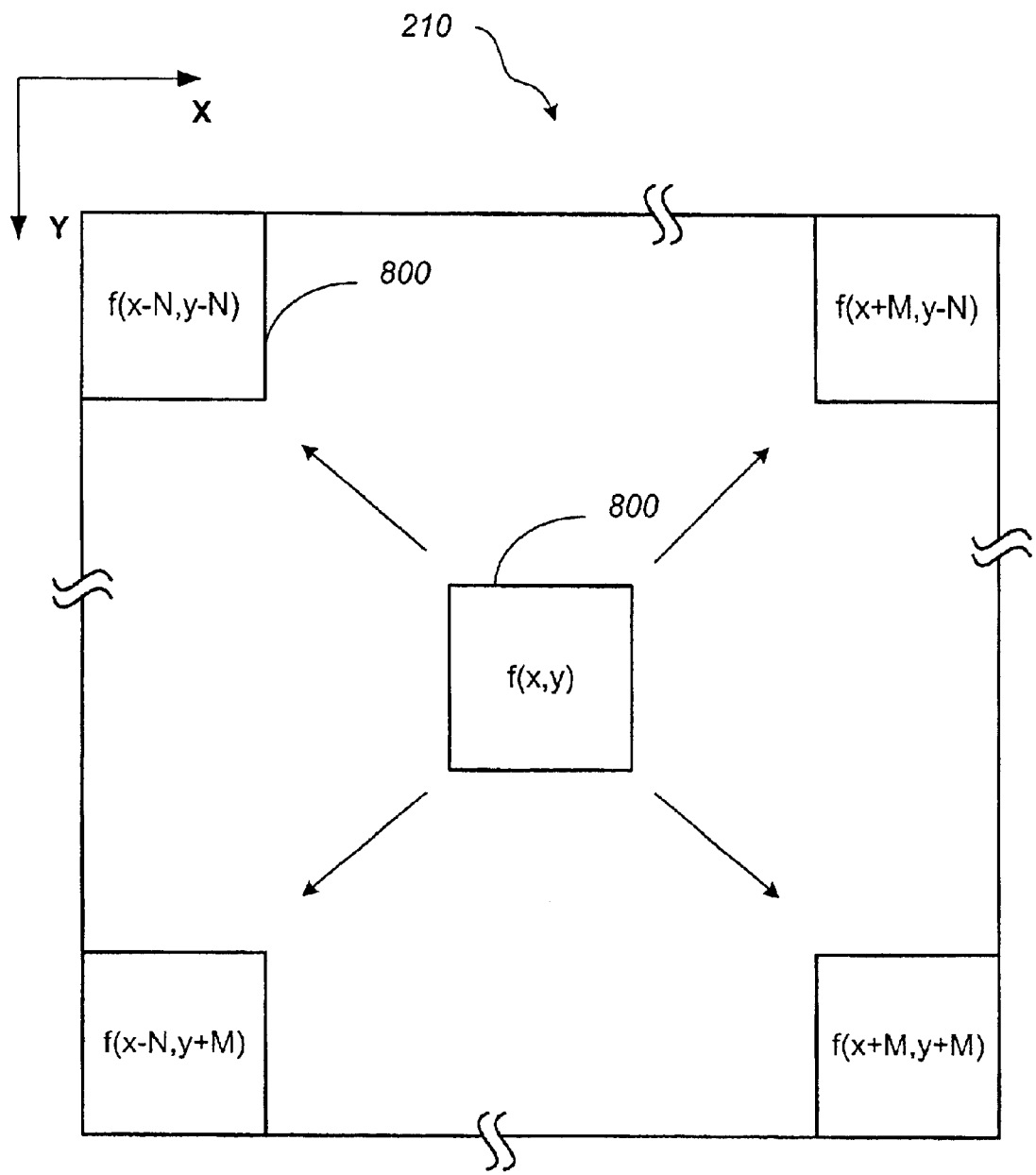
FIG. 8 is a block diagram illustrating an exemplar technique for dividing the circuit board of FIG. 5A into a plurality of observation views.

Reference is now directed to FIG. 8, which presents a block diagram illustrating an exemplar technique for dividing the circuit board of FIG. 5A into a plurality of observation views 800. As shown, the printed circuit 210 under observation may be divided into a plurality of views 800. In preferred embodiments, the circuit board inspection system 200 is configured to divide the mounting surface of the printed circuit board 210 into a plurality of views 800 having the same two-dimensional shape and size. This may be accomplished by selecting integers N and M in correspondence with the relative X and Y dimensions of the printed circuit assembly on the mounting surface of the printed circuit board 210. It should be appreciated that some circuit arrangements and device package structures may make it desirable to divide the printed circuit board 210 into views 800 having a rectangular shape (e.g., such that the views 800 encompass the electrical connections 216 associated with a printed circuit device) rather than the exemplar arrangement where each view 800 has sides of equal length.

It should be appreciated that the size and shape of the plurality of views 800 may vary in accordance with the density and the size of the various components mounted on the printed circuit board 210. As previously discussed, only those views that contain one or more electrical connections 216 designated as "defective" will be tested using the technique described above with regard to FIG. 7.

Special Cases

The above described technique for confirming defects in electrical connections may require modifications as applied to specific types of electronic devices and electrical connections. For example, not all joint and defect types are suitable for analysis and multiple Z-heights or focal planes 720. More specifically, pins associated with ball-grid array (BGA) devices and plated-through hole (PTH) contact pads should not be analyzed at multiple Z-heights because of the risk of overlooking a real defect. Solder connections associated with BGA devices begin in the shape of a ball. These solder balls are formed and placed on the circuit board contact pads. As the contact pad grid on the underside of the BGA device is aligned with the solder balls associated with the contact pad grid on the surface of the circuit board and heat is applied to the assembly, the solder in the balls flows and then cools thus coupling the BGA device (both electrically and physically) to the circuit board surface. Thus, the solder connections are sandwiched between the bottom surface of the BGA device and the circuit board, which slightly deforms most of the solder balls. This deformation makes solder joints associated with BGA devices inappropriate in most cases for Z-height adjustment and observation.

Furthermore, "short circuit" defects that are discovered during a first inspection should not be retested at various Z-heights because solder joint features that cause "short circuit" conditions could be missed as the focal plane is adjusted. These defects and devices, among others, may be dealt with via a filter in the software, which disregards data in these special cases if the Z-height (i.e., the focal plane of a sensor was adjusted).

Operation

Exemplar systems having been described above, sample methods for confirming electrical connection defects will now be discussed. In this regard, the following discussions describe steps illustrated in the flow charts of FIGS. 9 and 10. It should be understood that any process steps or blocks in these flow charts may represent modules, segments, or portions of executable code that include one or more instructions for implementing specific logical functions or steps in the associated process. It should be appreciated that although particular process steps are described, alternative implementations are feasible. Moreover, some method steps may be executed out of order from that shown or discussed, including substantially concurrently or in reverse order, depending on the functions involved.

Figure 9:
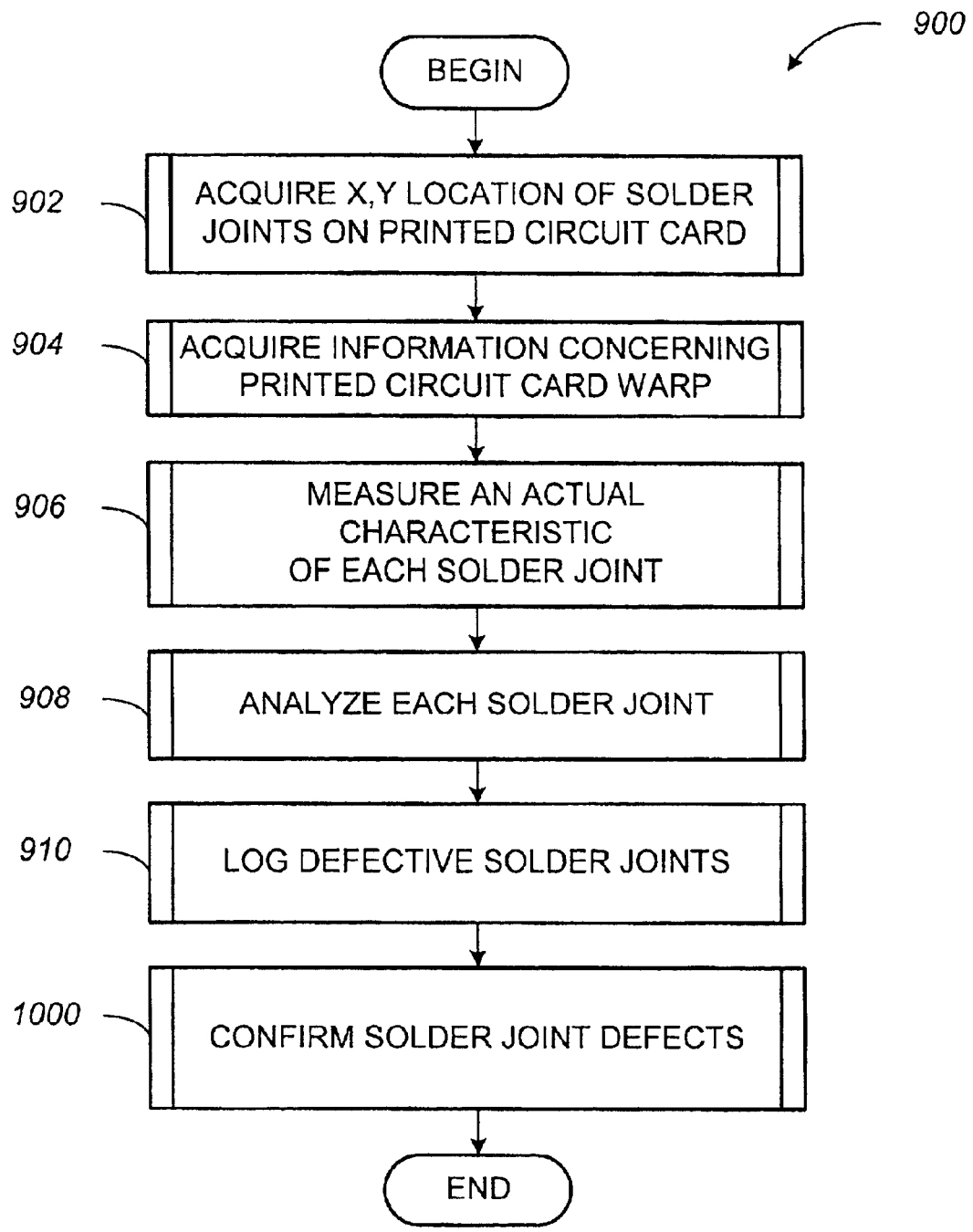
FIG. 9 is a flow chart illustrating a sample method for testing electrical connections on a printed circuit board that may be practiced by the circuit board inspection system of FIG. 3A.

In this regard, FIG. 9 presents a flow chart illustrating a sample method 900 for testing electrical connections 216 on a printed circuit board 210 that may be practiced by the circuit board inspection system 200 of FIG. 3A. As illustrated in FIG. 9, the method 900 may begin with step 902 where the circuit board inspection system 200 may be programmed to acquire information regarding the location of expected solder joints and/or other various electrical connections 216 located on one or more surfaces of a printed circuit board 210 under observation. The circuit board inspection system 200 may also be programmed to obtain information regarding the variation in the Z-dimension of the one or more device mounting surfaces of the printed circuit board 210 as indicated in step 904.

After having obtained information concerning the layout of expected electrical connections 216 and mounting surface variation over the mounting surface(s) of the printed circuit board 210 in steps 902 and 904, the circuit board inspection system 200 may be configured to examine one or more characteristics of the identified electrical connections 216 as illustrated in step 906. Thereafter, as illustrated in step 908, one or more methods may be used to analyze the identified electrical connections 216. Regardless of the quality of the images used and the various analyses applied, electrical connections 216 identified as failing to meet certain acceptance criteria may be deemed "defective." Identifying information associated with each of the "defective" electrical connections may be recorded as indicated in step 910 for use in step 1000 where the defect is further investigated.

Figure 10:
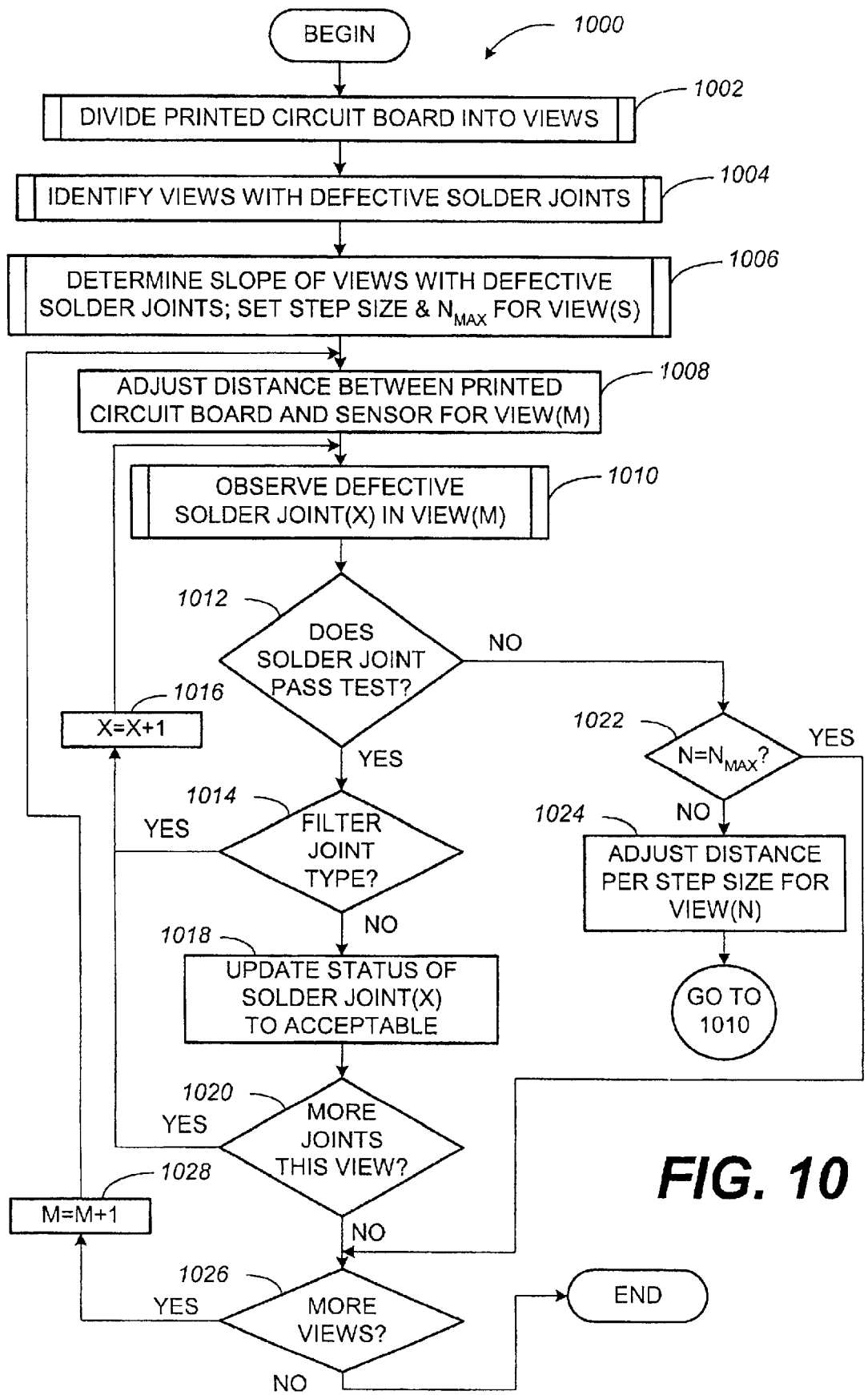
FIG. 10 is a flow chart illustrating a method for confirming solder joint defects that may be practiced by the circuit board inspection system of FIG. 3A.

FIG. 10 is a flow chart illustrating a method for confirming electrical connection defects 1000 that may be practiced by the circuit board inspection system 200 of FIG. 3A. As illustrated in FIG. 10, the method 1000 may begin with step 1002 where the circuit board inspection system 200 may be programmed to divide the printed circuit board 210 under observation into a number of views 800. Next, as shown in step 1004, the circuit board inspection system 200 may be configured to identify those views that encompass a defective electrical connection. Thereafter, as indicated in step 1006, a surface map 500 of the mounting surface of the circuit board 210 under observation may be used to determine the slope of the surface in each localized region of the mounting surface that contains an identified electrical connection defect. As previously described, the slope of each respective view 800 can be used together with other information regarding circuit density, the device associated with the defective connection, the connection type and size, etc. to formulate a focal plane adjustment step size and range.

Once the circuit board inspection system 200 has positioned the sensor focal plane as indicated in step 1008, the circuit board inspection system 200 is prepared to confirm one or more of the identified and recorded electrical connection defects. As indicated in step 1010 the confirmation may begin by obtaining an image at the new focal plane and applying one or more tests responsible for generating the conclusion that the associated electrical connection is defective.

Next, the circuit board inspection system 200 may be configured to perform the query of step 1012 to determine if the electrical connection presently under observation in the new image is indicative of an acceptable electrical connection. When it is the case that one or more characteristics observed in the image generated at the adjusted focal plane 720 is indicative of an acceptable electrical connection as indicated by the "YES" flow control arrow exiting the query of step 1012, the circuit board inspection system 200 may be programmed to determine if the electrical connection under observation is of a type that should not be considered for confirmation by applying the query of step 1014.

It should be appreciated that the query of step 1014 may also include the capability to bypass or otherwise overlook specific failure or defect conditions. For example, if the defect condition that originally identified the electrical connection under observation, as "defective" is typically considered indicative of a "short circuit" condition, it may be desirable to bypass any additional investigation of the associated electrical connection as testing using the method 1000 can result in overlooking a true circuit failure. When the particular electrical connection type or the defect condition is not suited to the method 1000 as indicated by the "YES" flow control branch exiting the query of step 1014, processing may continue by incrementing a defective electrical connection counter as indicated in step 1016. Thereafter, steps 1010 through 1016 may be repeated as necessary for the remaining defective electrical connections associated with the present view 800 under observation.

When the electrical connection is a type that should be considered or the underlying defect condition is a defect that should be considered for analysis via the method 1000, processing may continue with step 1018, where the circuit board inspection system 200 may be configured to update the status of the electrical connection under observation to "acceptable." The circuit board inspection system 200 may be programmed to overwrite an entry in a database, remove a flag, and/or add an entry or separate flag indicating that an observation during the method 1000 resulted in an "acceptable" electrical connection status condition.

After updating and/or otherwise recording the status of the electrical connection under test in step 1018, the circuit board inspection system 200 may be programmed to perform the query illustrated in step 1020 in order to determine if more defective electrical connections exist in the present view. When the response to the query of step 1020 is affirmative, the circuit board inspection system 200 may be configured to increment the electrical connection counter as illustrated in step 1016. Otherwise, when there are no "defective" electrical connections to observe within the present view 800, the circuit board inspection system 200 may continue with the query shown in step 1026.

Returning to the query of step 1012, when the circuit board inspection system 200 indicates that the electrical connection is defective as observed in the subsequent image, the circuit board inspection system 200 may be programmed to continue processing with step 1022, where a determination may be made if a desired focal plane adjustment range has been exceeded. When the adjustment range has been exceeded as indicated by the "YES" flow control arrow that exits the query of step 1022 processing may continue with the query of step 1026. When the adjustment range has not been exceeded, the focal plane is adjusted as indicated in step 1024 in accordance with the step size determined in step 1006. Thereafter, processing may jump to step 1010 where a subsequent diagnostic image of the electrical connection under observation may be acquired and analyzed as previously described.

Next, the circuit board inspection system 200 may be configured to perform the query of step 1026, where a determination is made if more defective electrical connections were identified in association with other views 800 of the circuit board 210 under observation. If more defective electrical connections were identified, as indicated by the "YES" flow control arrow that exits the query of step 1026, a view counter may be incremented as illustrated in step 1028 and steps 1008 through 1028 may be repeated as necessary to observe each identified defect on the printed circuit board 210. Once all the defective electrical connections on the circuit board 210 under observation have been processed, as indicated by the "NO" flow control arrow that exits the query of step 1026, the method for confirming solder joint defects may terminate.

The exemplar method for confirming electrical connection defects 1000 illustrated and described in connection with the flow chart of FIG. 10 adjusts the Z-height or focal plane of a sensor through a range of values while observing defects associated with a particular view. Those skilled in the art will appreciate that a suitably configured circuit board inspection system 200 may be programmed to adjust the Z-height or focal plane and then inspect each view that has at least one defect. As each view is imaged and observed, remaining defective conditions may be logged in a defective view list. After inspection of each view at a first adjusted Z-height, the circuit board inspection system 200 may be configured to adjust the Z-height and investigate defective connections associated with views remaining in the defective view list. The circuit board inspection system 200 may continue this investigate loop until a Z-height adjustment is contemplated that would exceed a predetermined maximum.

Figure 11A:
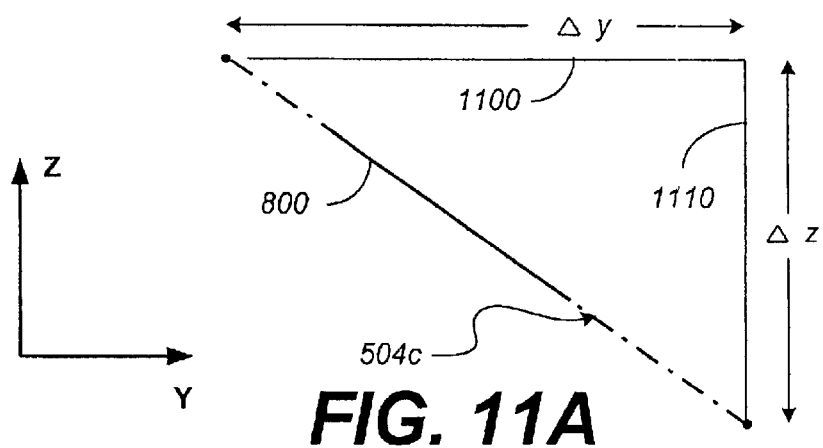
FIGS. 11A–11C illustrate a technique for determining the slope of an observation view from a surface map and a relationship between the slope, a sensor adjustment step-size, and a sensor adjustment range.
Figure 11B:
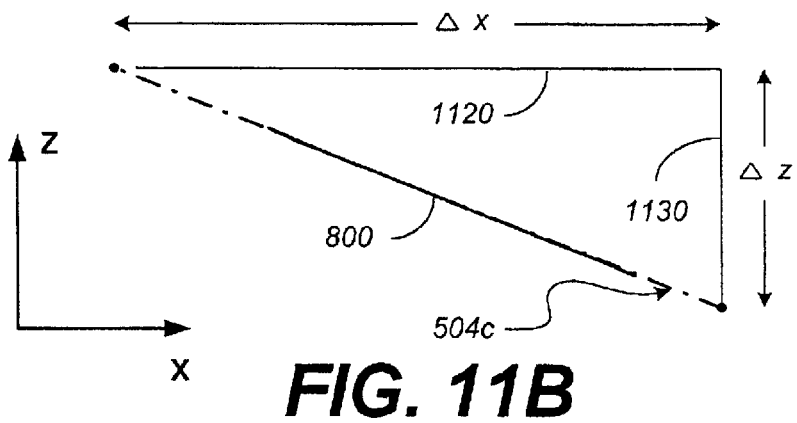
Figure 11C:
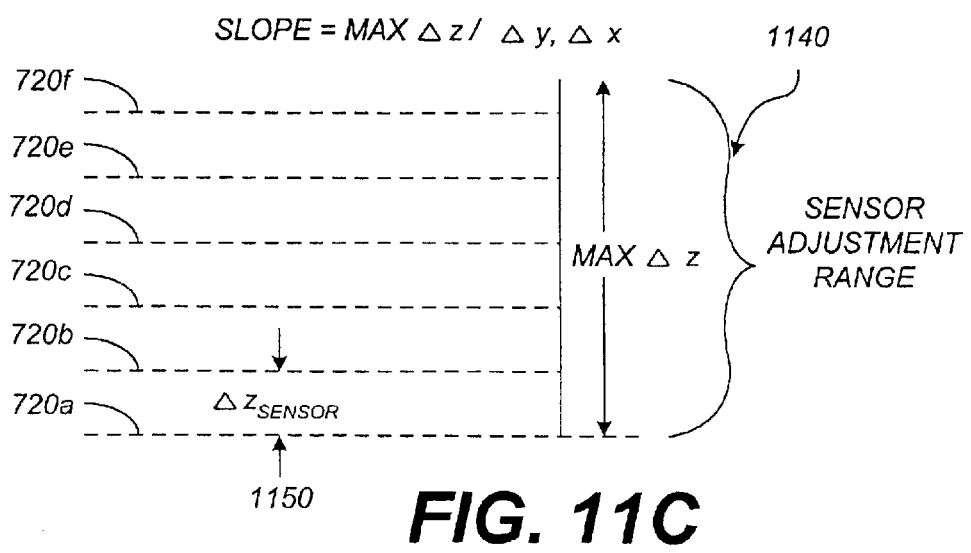

FIGS. 11A–11C illustrate a technique for determining the slope of an exemplar view 800 from a portion of a surface map 500. FIGS. 11A–11C also illustrate the relationship between the slope, a sensor adjustment step-size 1150, and a sensor adjustment range 1140. In this regard, FIG. 11A is a side view of the triangular plane 504c introduced in FIG. 5A. As illustrated in FIG. 11A, the triangular plane 504c may be characterized by its slope in the Y-Z plane. As is well known, the slope of the triangular plane 504c in the Y-Z plane may be determined from the change in the Z-dimension 1110 divided by the distance in the Y-dimension 1100. Similarly, FIG. 11B presents a side view of the triangular plane 504c in the X-Z plane. The slope of the triangular plane 504c in the X-Z plane may be determined from the change in the Z-dimension 1130 divided by the distance in the X-dimension 1120. Alternatively, the edges of the view 800 can be used to determine the maximum slope in the same manner as that described above by observing the change in the X, Y, and Z dimensions over the span of the view.

In accordance with a preferred embodiment, the maximum slope from the Y-Z and the X-Z planes is selected and used along with other criteria such as the density of the circuitry and the type of printed circuit devices and thus the electrical connection types in the view 800 of the circuit board 210. As illustrated in FIG. 11C the maximum slope observed within the two planes may be used to formulate a sensor focal plane adjustment range 1140. The focal plane adjustment range 1140 together with the selected step size 1150 will determine the number of possible adjustments and subsequent image acquisitions and analyses that may be performed by the circuit board inspection system 200.

While particular embodiments of the improved circuit board inspection system 200 have been disclosed in detail in the foregoing description and drawings for purposes of example, it will be understood by those skilled in the art that variations and modifications thereof can be made without departing from the scope of the invention as set forth in the following claims. For instance, other electrical connection types including solder-joint types and defect conditions may be designated for the filtering function of step 1014 in the method 1000 in addition to those mentioned above. The present disclosure is intended to include the application of these and other variations of the method for confirming electrical connection defects.

Thus, having described the systems and methods for confirming electrical connection defects, we claim the following:

1. A method for confirming defects, comprising the following steps:
    dividing the surface of a printed circuit board into a plurality of views;
    associating an electrical connection with a corresponding view when a characteristic associated with the connection in an observed image indicates that the connection is defective;
    analyzing the corresponding view to determine the slope of the surface of the printed circuit board across the view;
    adjusting the distance between the printed circuit board and a sensor in response to the slope of the view; and
    observing the characteristic associated with the connection in a subsequent image.

2. The method of claim 1, further comprising:
    considering the connection acceptable when the characteristic observed in the subsequent image is within a range of expected values.

3. The method of claim 2, further comprising:
    ignoring the acceptable determination from observation of a subsequent image when the characteristic associated with the connection is indicative of a specific defect.

4. The method of claim 2, further comprising:
    ignoring the acceptable determination from observation of a subsequent image when the connection is associated with a specified device type.

5. The method of claim 3, wherein the defect is a short circuit.

6. The method of claim 4, wherein the specified device type is a ball-grid array device.

7. The method of claim 2, further comprising:
    ignoring the acceptable determination from observation of a subsequent image when the connection is associated with a plated through hole.

8. The method of claim 1, wherein the step of observing comprises:
    deriving an adjustment range corresponding to the distance between the printed circuit board and a focal plane of a sensor;
    determining a number of adjustment steps contemplated to cover the adjustment range;
    repeating the adjusting and observing steps until the characteristic observed in the subsequent image is within a range of accepted values.

9. The method of claim 8, further comprising:
    considering the connection acceptable when the characteristic observed in the subsequent image is within the range of accepted values.

10. The method of claim 1, wherein the step of observing comprises:
    deriving an adjustment range for a focal plane of the sensor;
    determining a number of adjustment steps to cover the adjustment range;
    repeating the adjusting and observing steps until the number of adjustment steps has been exhausted and the characteristic observed in each of the subsequent images indicates that the connection is defective.

11. The method of claim 10, further comprising:
    reporting that the connection is defective.

12. The method of claim 11, wherein the step of reporting comprises storing an indicator that the connection failed a reexamination.

13. The method of claim 1, wherein the step of analyzing the corresponding view comprises identifying a centroid of the view.

14. The method of claim 13, further comprising:
    identifying the z-height of the centroid.

15. The method of claim 14, wherein the z-height of the centroid is identified using a surface map of the printed circuit board.

16. The method of claim 14, wherein the step of adjusting comprises assuming that the corresponding view is coplanar with a surface map plane that encompasses the centroid.

17. The method of claim 14, wherein the step of adjusting comprises determining the maximum height deviation between each of the vertexes of the corresponding view and the centroid.

18. An improved circuit board inspection system, comprising:
    means for segmenting a surface of a circuit board in response to an indication that an electrical connection on the circuit board is defective;
    means for associating the defective electrical connection with at corresponding segment; and
    means for observing a characteristic of each defective electrical connection that accounts for variation in height of the surface of the circuit board over the corresponding segment.

19. The system of claim 18, wherein the means for segmenting divides the surface of the circuit board into a plurality of rectangular segments.

20. The system of claim 19, wherein each of the plurality of rectangular segments encompasses an equivalent area of the surface.

21. The system of claim 19, wherein the means for observing adjusts a focal plane of a sensor.

22. The system of claim 21, wherein the focal plane of the sensor is adjusted in steps responsive to the maximum deviation in height across the segment.

23. The system of claim 22, further comprising:
    means for reporting that an electrical connection is acceptable when the characteristic observed in a subsequent image is within an acceptable range.

24. The system of claim 23, further comprising:
    means for filtering acceptable electrical connection determinations forwarded by the reporting means when the characteristic associated with the electrical connection is indicative of a specified defect condition.

25. The system of claim 23, further comprising:
means for filtering acceptable electrical connection determinations forwarded by the reporting means when the electrical connection is formed from a solder ball.

26. The system of claim 23, further comprising:
means for filtering acceptable electrical connection determinations forwarded by the reporting means when the electrical connection is associated with a plated-through hole.

27. The system of claim 21, wherein the focal plane of the sensor is adjusted in steps over a sensor adjustment range.

28. The system of claim 27, wherein the focal plane of the sensor is adjusted until the sensor reaches a limit of the sensor adjustment range.

29. The system of claim 27, wherein the focal plane of the sensor is adjusted until the characteristic observed in each of the subsequent images indicates that the electrical connection is defective.

30. The system of claim 29, further comprising:
means for reporting that the electrical connection is defective.

31. The method of claim 30, wherein the means for reporting comprises setting an indicator that the electrical connection has failed a reexamination.

32. A defect confirmation program stored on a computer-readable medium, comprising:
logic configured to segment a surface of a circuit board in response to an indication that at least one of a plurality of electrical connections is defective;
logic configured to associate the at least one defective electrical connection with a corresponding segment;
logic configured to adjust the focal plane of a sensor that accounts for variation in height of the surface of the circuit board across the corresponding segment;
logic configured to record a characteristic of the at least one defective electrical connection;
logic configured to identify the electrical connection as acceptable in response to a condition where a measured characteristic value falls within a designated range;
logic configured to supersede a previous indication that the electrical connection is defective in response to the logic configured to identify.

33. The program of claim 32, wherein the logic configured to segment divides the surface of the circuit board into a plurality of rectangular segments.

34. The program of claim 33, wherein each of the plurality of rectangular segments encompasses an equivalent area.

35. The program of claim 32, wherein the logic configured to adjust varies the focal plane of a sensor.

36. The program of claim 35, wherein the focal plane of the sensor is varied in steps responsive to the slope of the segment.

37. The program of claim 32, further comprising:
logic configured to mark an electrical connection acceptable when a measurement of the characteristic observed in a subsequent image is within an accepted range of values.

38. The program of claim 37, further comprising:
logic configured to remove the mark when the characteristic associated with the electrical connection is indicative of a short circuit condition.

39. The program of claim 37, further comprising:
logic configured to remove the mark when the electrical connection is associated with a ball-grid array device.

40. The program of claim 37, further comprising:
logic configured to remove the mark when the electrical connection is associated with a plated-through hole.

41. The program of claim 32, wherein the logic configured to adjust varies the distance between the focal plane of a sensor and the center of the corresponding segment in steps over a sensor adjustment range until the characteristic observed in an image is within an acceptable range.

42. The program of claim 32, wherein the logic configured to adjust varies the distance between the focal plane of a sensor and the center of the corresponding segment in steps over a sensor adjustment range until the focal plane reaches a limit of the sensor adjustment range.

* * * * *